United States Patent
Truhitte (10) Patent No.: US 8,987,054 B2
(45) Date of Patent: Mar. 24, 2015

(54) SEMICONDUCTOR DEVICES AND METHODS OF MAKING THE SAME

(71) Applicant: Darrell Truhitte, Phoenix, AZ (US)

(72) Inventor: Darrell Truhitte, Phoenix, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 9 days.

(21) Appl. No.: 13/840,411

(22) Filed: Mar. 15, 2013

(65) Prior Publication Data

US 2014/0273356 A1    Sep. 18, 2014

(51) Int. Cl.
| | | |
|---|---|---|
| *H01L 21/50* | (2006.01) | |
| *H01L 23/58* | (2006.01) | |
| *H01F 27/30* | (2006.01) | |
| *H01F 41/02* | (2006.01) | |
| *H01L 21/52* | (2006.01) | |
| *H01L 23/31* | (2006.01) | |
| *H01L 21/56* | (2006.01) | |

(52) U.S. Cl.
CPC ............. *H01L 21/52* (2013.01); *H01L 23/3121* (2013.01); *H01L 21/568* (2013.01); *H01L 2224/16225* (2013.01); *H01L 2224/48091* (2013.01); *H01L 2224/48465* (2013.01); *H01L 2224/73265* (2013.01)

USPC ................... 438/108; 438/110; 257/E21.022; 257/E21.502; 257/E21.599; 257/E23.048; 336/200; 361/728; 361/752; 361/821; 29/602.1

(58) Field of Classification Search
CPC ..... H01L 21/486; H01L 21/563; H01L 21/82; H01L 23/28; H01L 23/3121; H01L 23/3171; H01L 23/481; H01L 23/49811; H01L 23/5227; H01L 23/645; H01L 24/29; H01L 24/32; H01L 24/49; H01L 24/97; H01L 25/16; H01L 28/10; H01L 29/78; H01L 2924/1206; H01L 2924/19042; H01L 2924/30107

See application file for complete search history.

(56) References Cited

U.S. PATENT DOCUMENTS

| | | | |
|---|---|---|---|
| 8,043,898 B2 | 10/2011 | Lee et al. | |
| 2005/0046022 A1* | 3/2005 | Alter | 257/734 |
| 2012/0086538 A1 | 4/2012 | Chu | |
| 2012/0168938 A1* | 7/2012 | Gan et al. | 257/737 |

* cited by examiner

*Primary Examiner* — Brett Feeney
*Assistant Examiner* — Pamela E Perkins
(74) *Attorney, Agent, or Firm* — Noon Intellectual Property Law, P.C.

(57) ABSTRACT

In one embodiment, methods for making semiconductor devices are disclosed.

20 Claims, 10 Drawing Sheets

SEMICONDUCTOR DEVICES AND METHODS OF MAKING THE SAME

BACKGROUND

The present application relates, in general, to electronics, and more particularly, to semiconductors, structures thereof, and methods of forming semiconductor devices Semiconductor dies are typically formed on a silicon wafer. To reduce the thickness of certain semiconductor dies, wafer thinning may be performed. For example, it may be desirable to thin the silicon wafer on certain common mode filters to reduce the thickness of the semiconductor die. Thinning of the silicon wafer can lead to warping, and in certain circumstances, an unusable semiconductor device.

Semiconductor dies are often packaged on a lead frame where the contact pads of the semiconductor die are wire bonded to the leads. The wire bonding process can be time consuming, increase thickness of the package, and may increase impedance in the electrical circuit.

Accordingly, it is desirable to have techniques for forming thin semiconductor devices that reduce or prevent warpage. It is also desirable to have techniques for mounting different semiconductor dies without wire bonding.

BRIEF DESCRIPTION OF THE DRAWINGS

Embodiments of present application will become more fully understood from the detailed description and the accompanying drawings, which are not intended to limit the scope of the present application.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, or certain N-type of P-type doped regions, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. The use of the word approximately or substantially means that a value of element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION

The following description of embodiment(s) is merely illustrative in nature and is in no way intended to limit the invention, its application, or uses. The present application includes, among other things, a method of making a semiconductor device including: forming two or more first metal electrode pads on a conductive metal substrate; forming two or more second metal output electrode pads on the conductive metal substrate; forming a first dielectric layer on exposed regions of the conductive metals substrate between each of the first metal electrode pads and second metal electrode pads; forming two or more first inductive coils on the first dielectric layer, wherein each of the first inductive coils is electrically coupled to one of the first metal electrode pads; forming a second dielectric layer on the first inductive coils; forming two or more second inductive metal coils on the second dielectric layer, wherein each of the second inductive metal coils is electrically coupled to one of the second metal electrode pads; forming a third dielectric layer on the second inductive metal coils; forming two or more third metal electrode pads on the third dielectric layer, wherein each of the third contact pads are electrically coupled to one of the second inductive metal coils; electrically coupling one or more semiconductor dies to the third metal electrode pads; at least partially encapsulating the first dielectric layer, the second dielectric layer, the third dielectric layer, and the semiconductor dies in a molding material; and removing the conductive metal substrate to expose the first metal electrode pads and the second metal electrode pads.

Figure 1A:
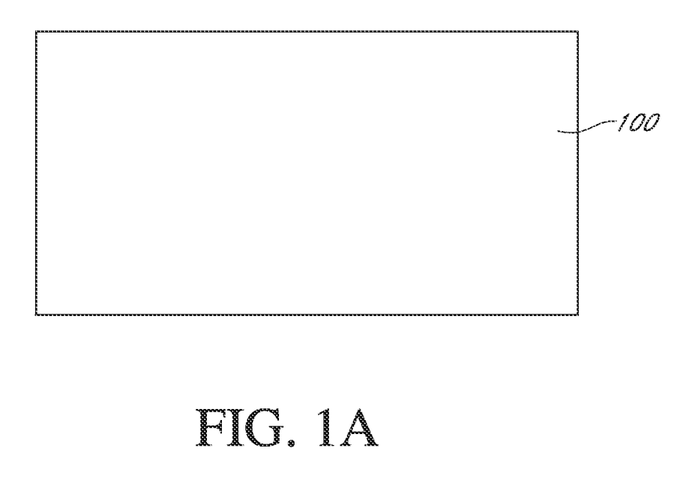
FIG. 1A is a top view illustrating one example of a metal conductive substrate in accordance with some embodiments of the present application.

FIGS. 1A-L illustrate one example of a method of making a semiconductor device in accordance with some embodiments of the present application. FIG. 1A is a top view illustrating one example of a metal conductive substrate in accordance with some embodiments of the present application. Metal conductive substrate 100 can generally be any conductive metal. As will be discussed further below, metal conductive substrate 100 may provide a sacrificial surface for assembling the semiconductor device thereon before removing metal conductive substrate 100. The metal conductive substrate may advantageously provide reduced warping relative to a silicon substrate when forming a relatively thin semiconductor device. Metal conductive substrate 100 may include, for example, copper, nickel, or alloys thereof (e.g., 42-nickel). As an example, the metal conductive substrate may be a copper substrate typically used to form a lead frame for semiconductor packaging. In some embodiments, the metal conductive substrate has a thickness of less than about 20 mils, 15 mils, or 10 mils.

Figure 1B:
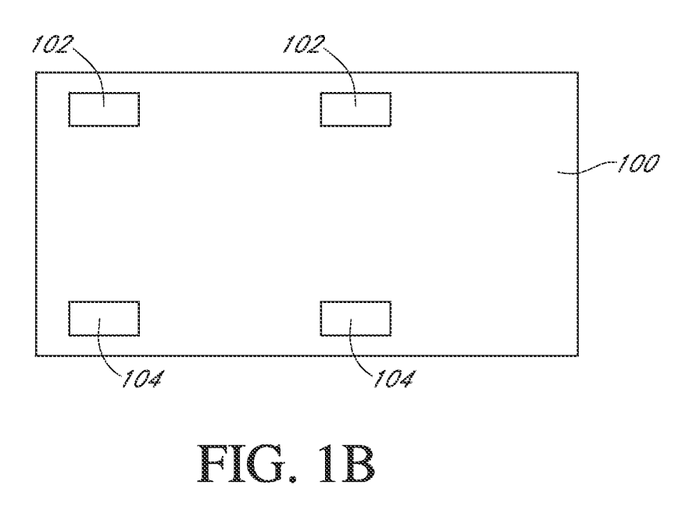
FIG. 1B a top view illustrating one example of metal electrode pads formed on a metal conductive substrate in accordance with some embodiments of the present application.

FIG. 1B is a top view illustrating one example of metal electrode pads formed on a metal conductive substrate in accordance with some embodiments of the present application. Input contact pads 102 and output contact pads 104 may be formed by depositing a conductive metal on metal conductive substrate using, for example, electroplating. In some embodiments, input contact pads 102 and output contact pads 104 each include copper, nickel, gold, or palladium. In some embodiments, input contact pads 102 and output contact pads 104 can be formed at about the same time. The contact pads (e.g., input contact pads 102 and output contact pads 104) may have a thickness of, for example, less than about 100 µm, less than about 75 µm, or less than about 50 µm.

Figure 1C:
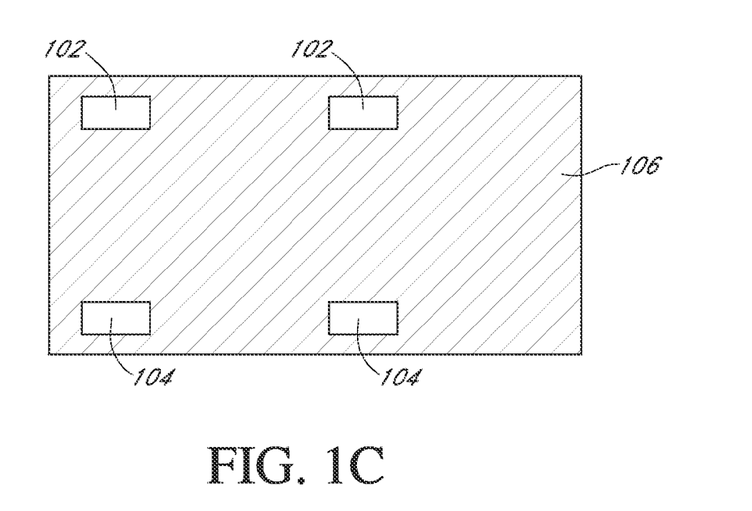
FIG. 1C is a top view illustrating one example of a first dielectric layer formed on the metal conductive substrate in accordance with some embodiments of the present application.

FIG. 1C is a top view illustrating one example of a first dielectric layer formed on the metal conductive substrate in accordance with some embodiments of the present application. First dielectric layer 106 can be formed on metal conductive substrate 100 by, for example, spin coating. Input contact pads 102 and output contact pads 104 can be exposed through first dielectric layer 106 to electrically couple to components above first dielectric layer 106. First dielectric layer 106, input contact pads 102, and output contact pads 104 may optionally be planarized to obtain a relatively even topography. First dielectric layer may have a thickness of, for example, less than about 100 µm, less than about 75 µm, or less than about 50 µm. In some embodiments, the first dielectric layer may include a resin, such as a polyimide.

Figure 1D:
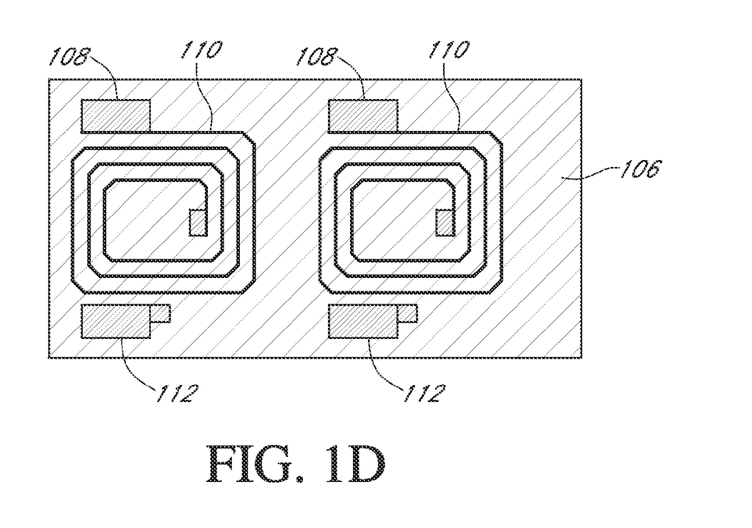
FIG. 1D is a top view illustrating one example of first inductive metal coils formed on the first dielectric in accordance with some embodiments of the present application.

FIG. 1D is a top view illustrating one example of first inductive metal coils formed on the first dielectric in accordance with some embodiments of the present application. Metal conductive regions 108 are disposed on input contact pads 102 to electrically couple first inductive metal coils 110 with input contact pads 102. Metal conductive regions 112 are also disposed on output contact pads 104; however, metal conductive regions 112 are not electrically coupled to first inductive metal coils 110. Metal conductive regions 108, first inductive metal coils 110, and metal conductive regions 112 may be together formed, in some embodiments, by depositing a metal conductive layer and then etching the metal conductive layer to form the components. As an example, a conductive metal can be sputtered onto first dielectric layer 106, input contact pads 102 and output contact pads 104. A photoresist pattern can be formed on the conductive metal layer before etching to form the components. In some embodiments, metal conductive regions 108 and metal conductive regions 112 have a thickness of less than about 25 µm, or less than about 15 µm. In some embodiments, metal conductive regions 108 and metal conductive regions 112 have about the same thickness. In some embodiments, first inductive metal coils 110 have a thickness of less than about 15 µm, or less than about 10 µm. In some embodiments, first inductive metal coils 110 have a thickness that is less than or equal to a thickness of metal conductive regions 108 and metal conductive regions 112. The metal conductive regions and inductive metal coils may be formed from, for example, copper. The center pad of the first inductive metal coils 110 can be connected to the metal conductive regions 112 in subsequent layers, which is well known by those skilled in the art of forming multi-layer circuits.

Figure 1E:
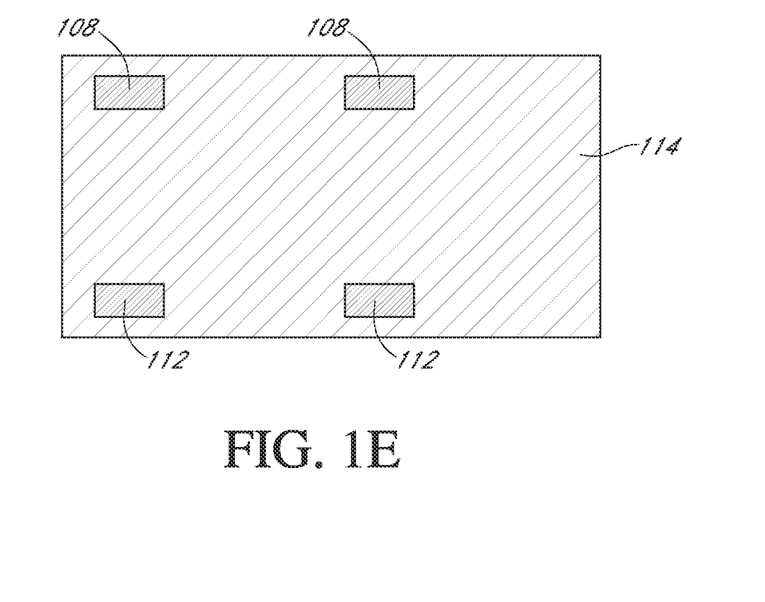
FIG. 1E is a top view illustrating one example of a second dielectric layer formed on the first dielectric layer in accordance with some embodiments of the present application.

FIG. 1E is a top view illustrating one example of a second dielectric layer formed on the first dielectric layer in accordance with some embodiments of the present application. Second dielectric layer 114 can be formed on first dielectric layer 106 and first inductive metal coils 110. Second dielectric layer 114 can be formed, for example, by spin coating a suitable dielectric material. In some embodiments, second dielectric 114 can include a resin, such as a polyimide. Second dielectric layer 114 may include the same or different composition as first dielectric layer 106. As an example, second dielectric layer 114 and first dielectric layer 106 may both be a polyimide layer. Second dielectric layer 114 may, in some embodiments, have a thickness of less than about 25 µm, or less than about 15 µm. Metal conductive regions 108 and metal conductive regions 112 are exposed at the surface of second dielectric layer 114. Metal conductive regions 108, metal conductive regions 112, and second dielectric layer 114 can each be planarized to obtain a relatively smooth topography.

Figure 1F:
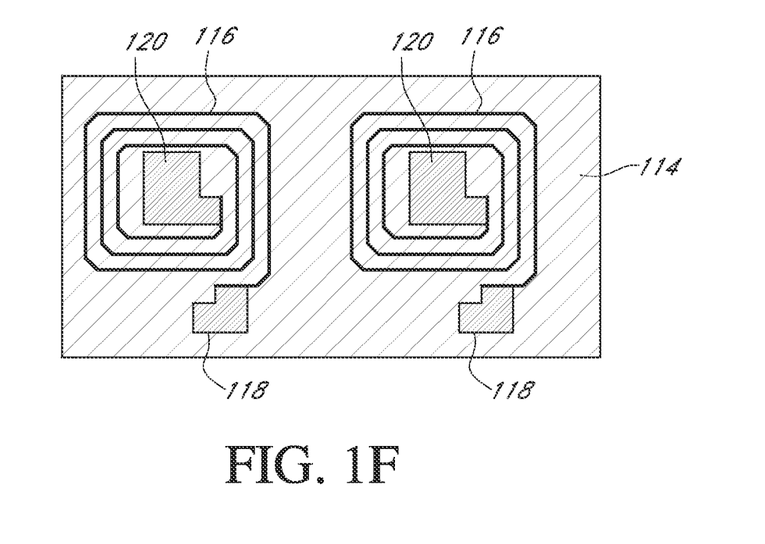
FIG. 1F is a top view illustrating one example of a second inductive metal coils formed on the second dielectric layer in accordance with some embodiments of the present application.

FIG. 1F is a top view illustrating one example of a second inductive metal coils formed on the second dielectric layer in accordance with some embodiments of the present application. Second inductive metal coils 116 can be formed on second dielectric layer 114. Each of second inductive metal coils 116 is electrically coupled to one of metal conductive regions 118 and one of metal conductive region 120. Metal conductive region 118 can be electrically coupled to metal conductive region 112. Second inductive metal coils 116 can be laterally aligned over first inductive metal coils 110 such that the inductive metal coils are inductively coupled. Metal conductive regions 118, second inductive metal coils 116, and metal conductive regions 120 may be together formed, in some embodiments, by depositing a metal conductive layer and then etching the metal conductive layer to form the components. For example, a copper layer may formed and then etched. In some embodiments, metal conductive regions 116 and metal conductive regions 120 have a thickness of less than about 25 µm or less than about 15 µm. In some embodiments, metal conductive regions 118 and metal conductive regions 120 have about the same thickness. In some embodiments, second inductive metal coils 116 have a thickness of less than about 15 µm or less than about 10 µm. In some embodiments, second inductive metal coils 116 have a thickness that is less than or equal to a thickness of metal conductive regions 118 and metal conductive regions 120.

Figure 1G:
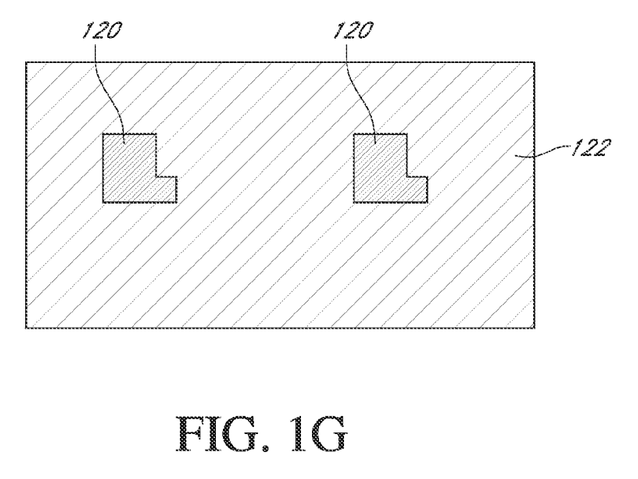
FIG. 1G is a top view illustrating one example of a third dielectric layer formed on the second dielectric layer in accordance with some embodiments of the present application.

FIG. 1G is a top view illustrating one example of a third dielectric layer formed on the second dielectric in accordance with some embodiments of the present application. Third dielectric layer 122 can be formed on second dielectric layer 114 and second inductive metal coils 116. Third dielectric layer 122 can be formed, for example, by spin coating a suitable dielectric material. In some embodiments, third dielectric 122 can include a resin, such as a polyimide. Third dielectric layer 122 may include the same or different composition as first dielectric layer 106 and/or second dielectric layer 114. As an example, third dielectric layer 114, second dielectric layer 114, and first dielectric layer 106 may each be a polyimide layer. Third dielectric layer 122 may, in some embodiments, have a thickness of less than about 25 µm, or less than about 15 µm. Metal conductive regions 120 are exposed at the surface of second dielectric layer 114. Metal conductive regions 120 and third dielectric layer 122 may each be planarized to obtain a relatively smooth topography.

Figure 1H:
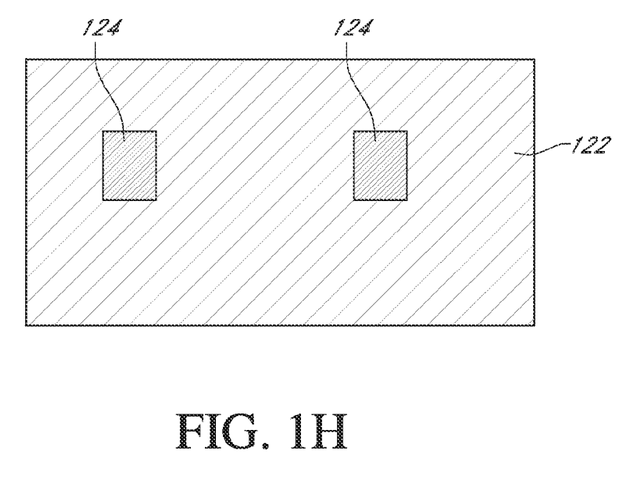
FIG. 1H is a top view illustrating one example of contact pads disposed on a third dielectric layer in accordance with some embodiments of the present application.

FIG. 1H is a top view illustrating one example of contact pads disposed on a third dielectric layer in accordance with some embodiments of the present application. Contact pads 124 can be formed on third dielectric layer 122 and are electrically coupled to metal conductive regions 120. The contact pads may be formed, for example, by sputtering and etching a conductive metal, such as copper. In some embodiments, the contact pads have a thickness of less than about 60 µm, or less than about 40 µm.

Figure 1I:
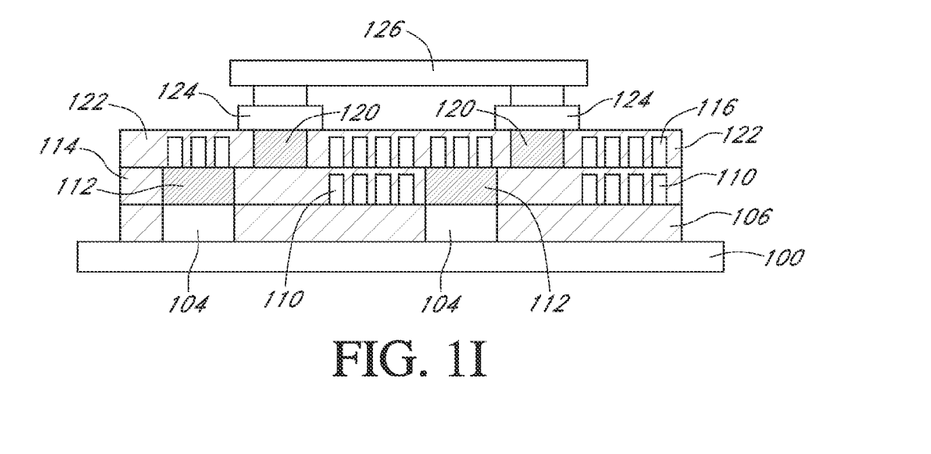
FIG. 1I is a cross-sectional view illustrating one example of positioning a semiconductor die in the semiconductor device.

FIG. 1I is a cross-sectional view illustrating one example of a semiconductor die in the semiconductor device. Semiconductor die 126 can have both contact pads soldered to contact pads 124 in a flip-chip design. For example, solder paste can be applied to contact pads 124 and semiconductor die 126 positioned over contact pads 124 before performing reflow. Semiconductor die 126 can be, for example, an electrostatic discharge protection semiconductor. The semiconductor die may, for example, have a thickness of less than about 200 µm, less than about 150 µm, or less than about 100 µm.

Figure 1J:
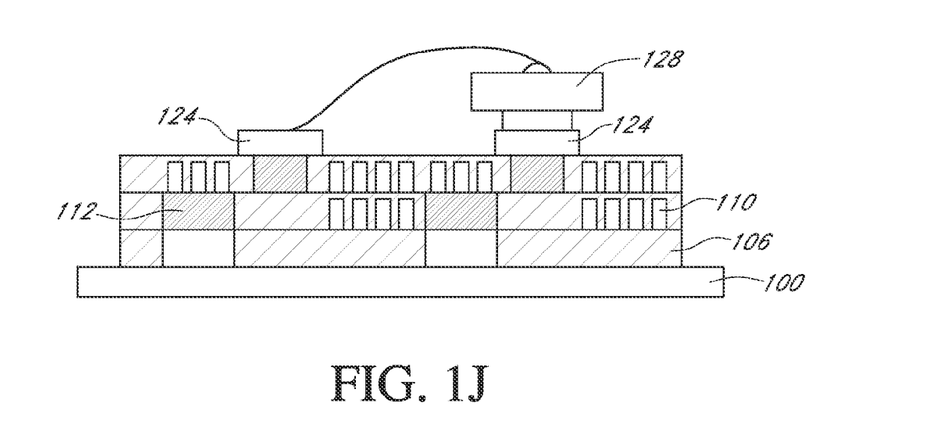
FIG. 1J is a cross-sectional view illustrating one example of positioning and wire bonding a semiconductor die in the semiconductor device.

FIG. 1J is a cross-sectional view illustrating one example of positioning and wire bonding a semiconductor die in the semiconductor device. Semiconductor die 128 may soldered to one of contact pads 124 and wire bonded to one of contact pads 124. Generally, a wire-bonded semiconductor die will produce a thicker semiconductor device because the wire bonding can require addition spacing above the semiconductor die. For purposes of describing the method of making semiconductor device, the remaining figures show semiconductor die 126, which does not include a wire-bonded contact. However, a wire-bonded semiconductor die may alternatively be used.

Figure 1K:
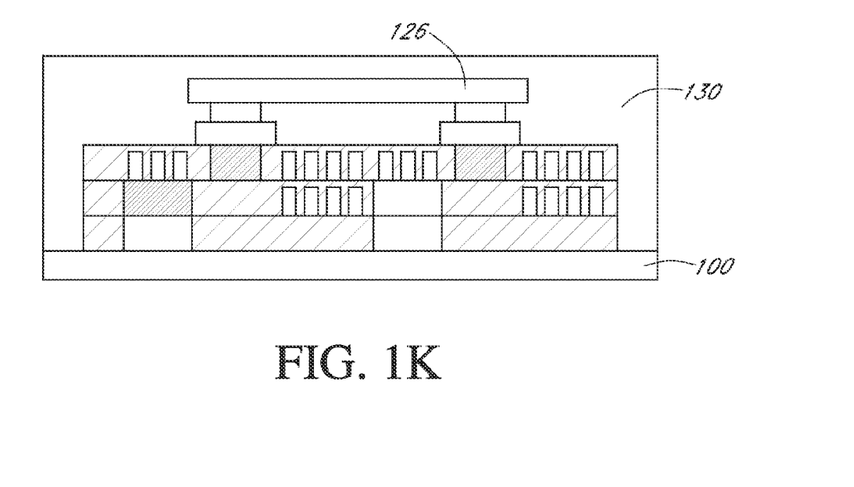
FIG. 1K is a cross-sectional view illustrating one example of encapsulating the semiconductor device in a molding material.

FIG. 1K is a cross-sectional view illustrating one example of encapsulating the semiconductor device in a molding material. The semiconductor device can be at least partially encapsulated in molding material 130. Mold material 130 can be, for example, a resin, such as an epoxy. The molding material can be applied to the semiconductor device and the cured. The molding material may have a thickness of, for example, less than about 750 µm, less than about 500 µm, or less than about 400 µm.

Figure 1L:
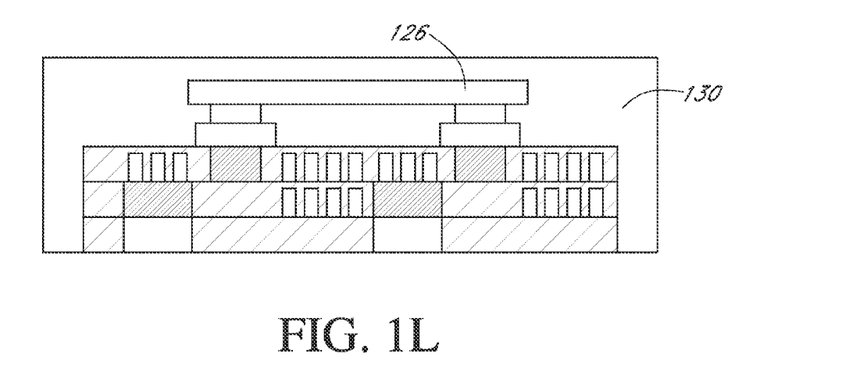
FIG. 1L is a cross-sectional view illustrating one example of the semiconductor after removing the metal conductive substrate.

FIG. 1L is a cross-sectional view illustrating one example of the semiconductor after removing the metal conductive substrate. Metal conductive substrate 100 can be removed by, for example, wet etching. After removal, the final semiconductor device may be obtained. Input contact pads 102 and output contact pads 104 are exposed after removing metal conductive substrate 100 so that they may electrically coupled to other devices (e.g., a printed circuit board).

After producing the semiconductor device, the semiconductor device may optionally be singulated. For example, the semiconductor device may be formed in an array along with other identical semiconductor device. The array can be cut into individual techniques using standard techniques, such as dicing.

The resulting semiconductor device may, in some embodiments, be configured as a common mode filter. In some embodiments, the semiconductor device is a common mode filter electrically coupled to an electrostatic discharge semiconductor die. The resulting semiconductor device may, in some embodiments, advantageously have a relatively low thickness. For example, by forming the semiconductor device on the metal conductive substrate, less warping may be observed. In some embodiments, the semiconductor device has a total thickness of less than about 750 µm, less than about 500 µm, or less than about 400 µm.

Figure 2A:
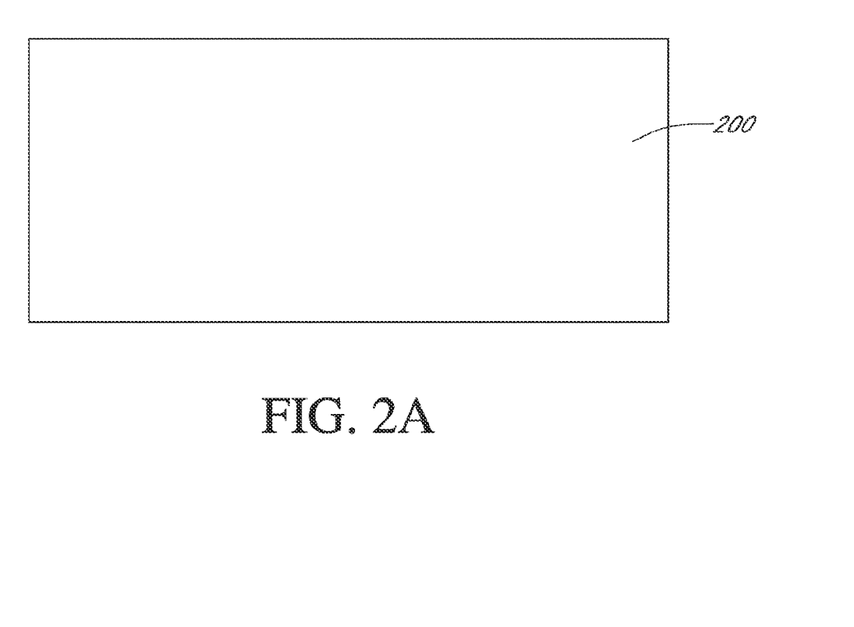
FIG. 2A is a top view illustrating one example of a metal conductive substrate in accordance with some embodiments of the present application.

FIGS. 2A-F illustrate one example of a method of making a semiconductor device in accordance with some embodiments of the present application. FIG. 2A is a top view illustrating one example of a metal conductive substrate in accordance with some embodiments of the present application. Metal conductive substrate 200 can generally have the same characteristics as metal conductive substrate 100 depicted in FIG. 1A. For example, the metal conductive substrate may be a copper substrate typically used to form a lead frame for semiconductor packaging.

Figure 2B:
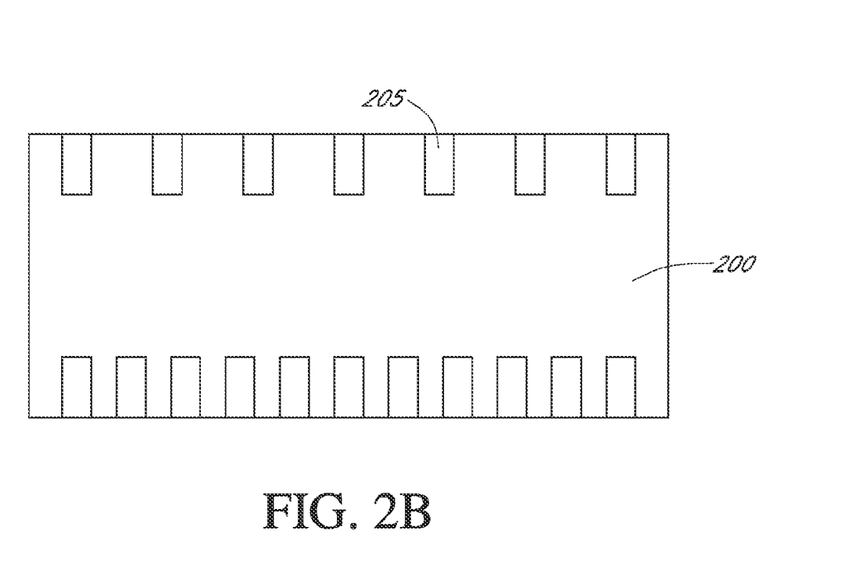
FIG. 2B is a top view illustrating one example of metal electrode pads formed on a metal conductive substrate in accordance with some embodiments of the present application.

FIG. 2B is a top view illustrating one example of metal electrode pads formed on a metal conductive substrate in accordance with some embodiments of the present application. Metal electrode pads 205 can be formed on metal conductive substrate 200 by, for example, electroplating. Generally, metal electrode pads 205 can have the same characteristics as input contact pads 102 and/or output contact pads 104 depicted in FIG. 1B. For example, metal electrode pads 205 may each include copper, nickel, gold, or palladium.

Figure 2C:
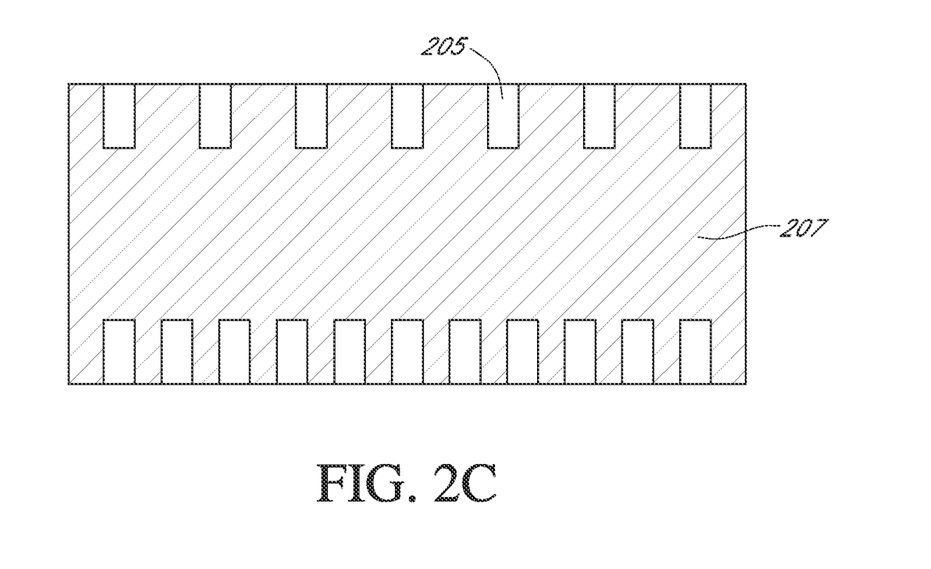
FIG. 2C is a top view illustrating one example of a dielectric layer formed on the metal conductive substrate in accordance with some embodiments of the present application.

FIG. 2C is a top view illustrating one example of a dielectric layer formed on the metal conductive substrate in accordance with some embodiments of the present application. Dielectric layer 207 can be formed on metal conductive substrate 200 by, for example, spin coating. Metal electrode pads 205 can be exposed through dielectric layer 207 to electrically couple to components above dielectric layer 207. Generally, dielectric layer 207 can have the same characteristics as first dielectric layer 106 depicted in FIG. 1C. For example, dielectric layer 207 may include a resin, such as a polyimide.

Figure 2D:
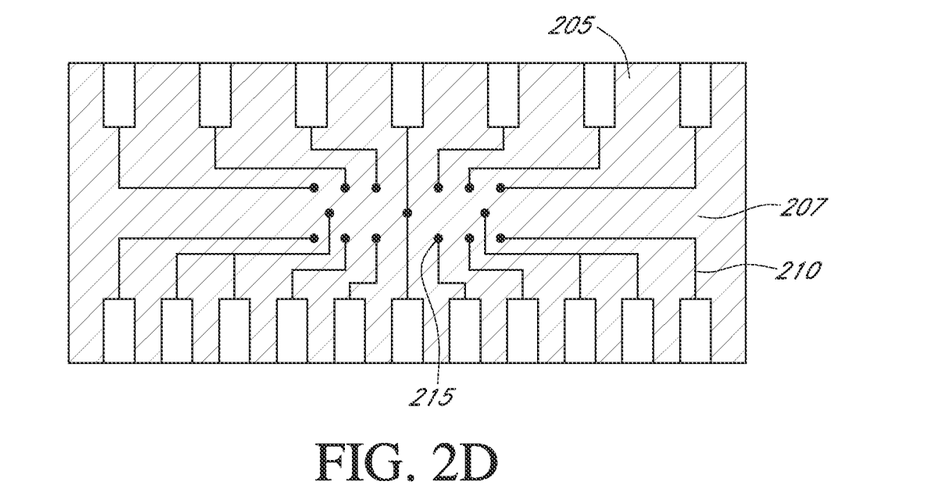
FIG. 2D is a top view illustrating one example of metal conductive lines and metal contacts formed on the metal conductive substrate in accordance with some embodiments of the present application.
Figure 2E:
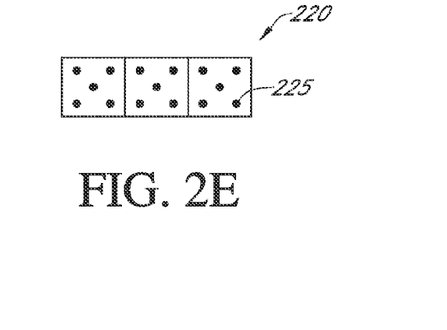
FIG. 2E shows a top view of a semiconductor dies that may be incorporated into the semiconducting device.

FIG. 2D is a top view illustrating one example of metal conductive lines and metal contacts formed on the metal conductive substrate in accordance with some embodiments of the present application. Metal conductive lines 210 and metal contacts 215 can be formed on dielectric layer 207. Metal conductive lines 210 and metal contacts 215 may be together formed, in some embodiments, by depositing a metal conductive layer and then etching the metal conductive layer to form the components. For example, a copper layer may be formed and then etched. Metal conductive lines 210 can be configured to electrically couple metal contacts 215 with metal electrode pads 205. FIG. 2E shows a top view of a semiconductor dies that may be incorporated into the semiconducting device. Semiconductor die 200 can include solder bumps 225 on contact pads (not shown) of semiconductor die 200.

Figure 2F:
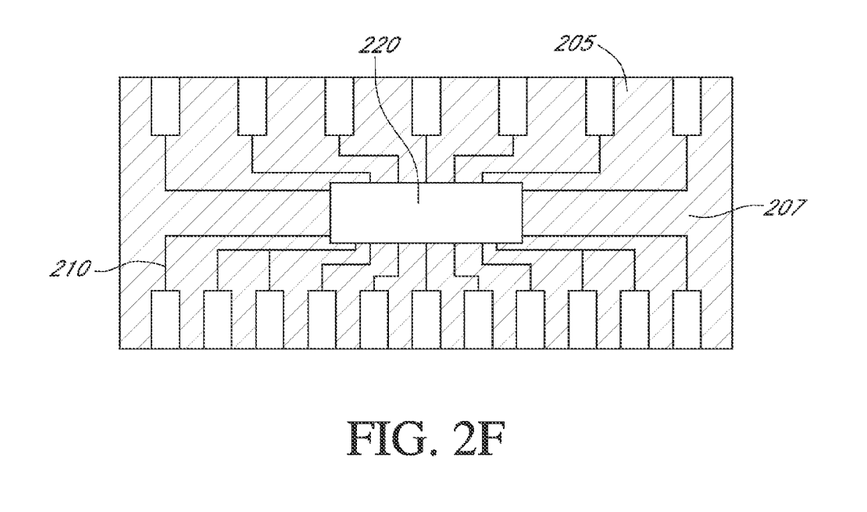
FIG. 2F is a top view illustrating one example of a semiconductor die in the semiconductor device.

FIG. 2F is a top view illustrating one example of a semiconductor die in the semiconductor device. Semiconductor die 220 can be positioned so that solder bumps 225 can be aligned over metal contacts 215. Semiconductor die 220 can then be soldered to metal contacts 215 such that the contact pads of semiconductor die 220 are electrically coupled to metal electrode pads 205.

Figure 2G:
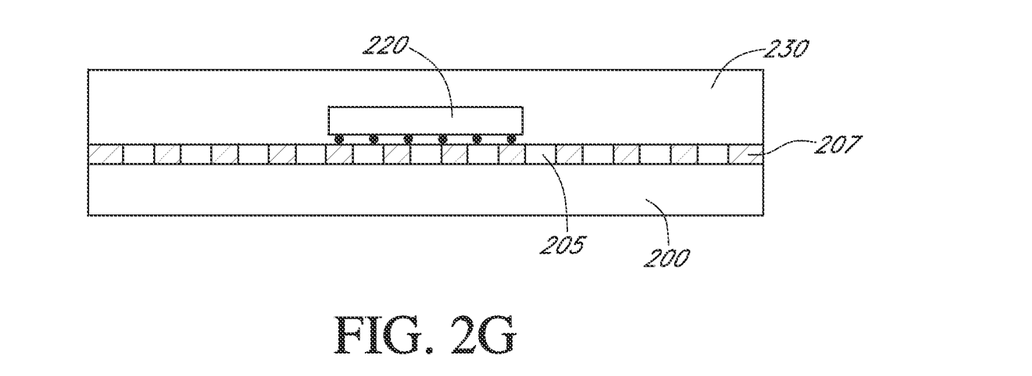
FIG. 2G is a cross-sectional view illustrating one example of encapsulating the semiconductor device in a molding material.

FIG. 2G is a cross-sectional view illustrating one example of encapsulating the semiconductor device in a molding material. The semiconductor device can be at least partially encapsulated in molding material 230. Molding material 230 can be, for example, a resin, such as an epoxy. The molding material can be applied to the semiconductor device and then cured. The molding material may have a thickness of, for example, less than about 750 µm, less than about 500 µm, or less than about 400 µm.

Figure 2H:
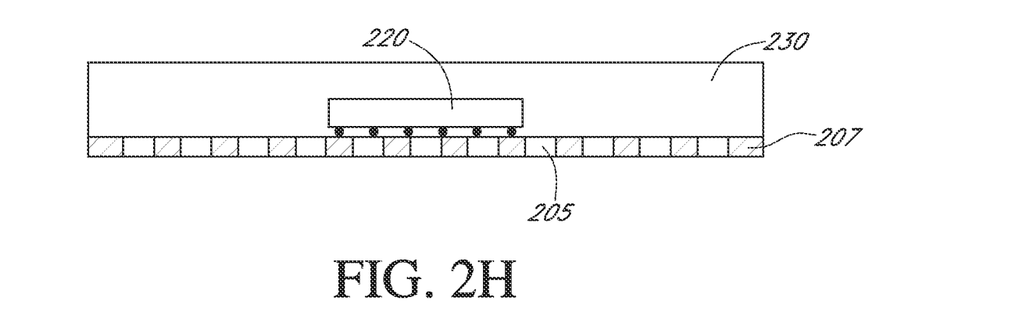
FIG. 2H is a cross-sectional view illustrating one example of the semiconductor after removing the metal conductive substrate.

FIG. 2H is a cross-sectional view illustrating one example of the semiconductor after removing the metal conductive substrate. Metal conductive substrate 200 can be removed, for example, by wet etching. After removal, the final semiconductor device may be obtained. Metal electrode pads 205 can be exposed so they may be electrically coupled to other devices (e.g., a printed circuit board).

After producing the semiconductor device, the semiconductor device may optionally be singulated. For example, the semiconductor device may be formed in an array along with other identical semiconductor device. The array can be cut into individual devices using standard techniques, such as dicing.

The resulting semiconductor device may, in some embodiments, be an electrostatic discharge protection device. The method of making the semiconducting device may advantageously exclude wire bonding the semiconductor die to contact pads on the semiconductor die. By excluding wire bonding, the method of manufacturing the semiconductor device may be simplified. In particular, the semiconductor die can be coupled to the contact pads using metal conducting lines at much greater distances than wire bonds. This may permit placing a single semiconductor dies relative placing multiple dies distributed on the substrateso that wire bonding can be performed.

From all the foregoing one skilled in the art can determine that according to one embodiment, a method of making a semiconductor device comprises: forming two or more first metal electrode pads on a conductive metal substrate; forming two or more second metal output electrode pads on the conductive metal substrate; forming a first dielectric layer on exposed regions of the conductive metals substrate between each of the first metal electrode pads and second metal electrode pads; forming two or more first inductive coils on the first dielectric layer, wherein each of the first inductive coils is electrically coupled to one of the first metal electrode pads; forming a second dielectric layer on the first inductive coils; forming two or more second inductive metal coils on the second dielectric layer, wherein each of the second inductive metal coils is electrically coupled to one of the second metal electrode pads; forming a third dielectric layer on the second inductive metal coils; forming two or more third metal electrode pads on the third dielectric layer, wherein each of the third contact pads are electrically coupled to one of the second inductive metal coils; electrically coupling one or more semiconductor dies to the third metal electrode pads; at least partially encapsulating the first dielectric layer, the second dielectric layer, the third dielectric layer, and the semiconductor dies in a molding material; and removing the conductive metal substrate to expose the first metal electrode pads and the second metal electrode pads.

From all the foregoing one skilled in the art can determine that according to one embodiment, a method of making a semiconductor device comprises: forming two or more metal electrode pads on a conductive metal substrate; forming a first dielectric layer on exposed regions of the conductive metals substrate between the metal electrode pads; forming two or more first conductive metal lines on the first dielectric layer, wherein each of the first conductive metal lines is electrically coupled to at least one of the metal electrode pads; forming two or more metal contact pads on the first dielectric layer, wherein each of the contact pads is electrically coupled to at least one of the metal electrodes pads via one or more of the first conductive metal lines; electrically coupling one or more semiconductor dies to the two or more contact pads, wherein the semiconductor dies are electrically coupled to the metal electrode pads; at least partially encapsulating the first dielectric layer and the semiconductor dies in a molding material; and removing the conductive metal substrate to expose the metal electrode pads.

From all the foregoing one skilled in the art can determine that according to one embodiment, a method of making a semiconductor device comprises: forming two or more metal electrode pads on a conductive metal substrate; forming a first dielectric layer on exposed regions of the conductive metals substrate between the metal electrode pads; forming a one or more additional dielectric layers on the first dielectric layer; forming two or more contact pads on the additional dielectric layers, wherein each of the contact pads is electrically coupled to one of the metal electrode pads; electrically coupling one or more semiconductor dies to the contact pads; at least partially encapsulating the first dielectric layer, the additional dielectric layers, and the semiconductor dies in a molding material; removing the conductive metal substrate to expose the metal electrode pads; and singulating the semiconductor device from an array of identical semiconductor devices.

In view of all of the above, it is evident that a novel device and method is disclosed. Included, among other features, methods of forming a semiconductor device on a metal conductive substrate and then removing the metal conductive substrate to expose contact pads. Furthermore, semiconductor device obtains by these methods are disclosed.

While the subject matter of the invention is described with specific preferred embodiments and example embodiments, the foregoing drawings and descriptions thereof depict only typical embodiments of the subject matter and are not therefore to be considered to be limiting of its scope, it is evident that many alternatives and variations will be apparent to those skilled in the art. For example, the subject matter has been described with respect to particular configurations for the semiconductor die, such as a common mode filter, however various different integrated circuits may also be used.

As the claims hereinafter reflect, inventive aspects may lie in less than all features of a single foregoing disclosed embodiment. Thus, the hereinafter expressed claims are hereby expressly incorporated into this Detailed Description, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

What is claimed is:

1. A method for making a semiconductor device, the method comprising:
    forming two or more first metal electrode pads on a conductive metal substrate;
    forming two or more second metal electrode pads on the conductive metal substrate;
    forming a first dielectric layer on exposed regions of the conductive metal substrate between each of the first metal electrode pads and second metal electrode pads;
    forming two or more first inductive coils on the first dielectric layer, wherein each of the first inductive coils is electrically coupled to one of the first metal electrode pads;
    forming a second dielectric layer on the first inductive coils;
    forming two or more second inductive metal coils on the second dielectric layer, wherein each of the second inductive metal coils is electrically coupled to one of the second metal electrode pads;
    forming a third dielectric layer on the second inductive metal coils;
    forming two or more third metal electrode pads on the third dielectric layer, wherein each of the third contact pads are electrically coupled to one of the second inductive metal coils;
    electrically coupling one or more semiconductor dies to the third metal electrode pads;
    at least partially encapsulating the first dielectric layer, the second dielectric layer, the third dielectric layer, and the semiconductor dies in a molding material; and
    removing the conductive metal substrate to expose the first metal electrode pads and the second metal electrode pads.

2. The method of claim 1, wherein the metal conductive substrate comprises copper, nickel, or an alloy thereof.

3. The method of claim 1, wherein forming two or more first metal electrode pads on the conductive metal substrate comprises electroplating a conductive metal on the conductive metal substrate.

4. The method of claim 1, wherein forming two or more second metal electrode pads on the conductive metal substrate comprises electroplating a conductive metal on the conductive metal substrate.

5. The method of claim 1, wherein the first dielectric layer comprises a resin.

6. The method of claim 5, wherein the resin is a polyimide.

7. The method of claim 1, wherein forming the first dielectric layer on exposed regions of the conductive metal substrate between the first metal electrode pads and the second metal electrode pads comprises sputtering a dielectric material on exposed regions of the conductive metal substrate.

8. The method of claim 1, further comprising singulating the semiconductor device from an array of identical semiconductor devices.

9. The method of claim 1, wherein at least one of the semiconductor dies is an electrostatic discharge protection semiconductor die.

10. The method of claim 1, wherein the semiconductor device has a thickness of less than about 500 μm.

11. A method for making a semiconductor device, the method comprising:
    forming two or more metal electrode pads on a conductive metal substrate;
    forming a dielectric layer on exposed regions of the conductive metal substrate between the metal electrode pads;
    forming two or more conductive metal lines on the dielectric layer, wherein each of the conductive metal lines is electrically coupled to at least one of the metal electrode pads;
    forming two or more metal contact pads on the dielectric layer, wherein each of the contact pads is electrically coupled to at least one of the metal electrodes pads via one or more of the conductive metal lines;
    electrically coupling one or more semiconductor dies to the two or more contact pads, wherein the semiconductor dies are electrically coupled to the metal electrode pads;
    at least partially encapsulating the dielectric layer and the semiconductor dies in a molding material; and
    removing the conductive metal substrate to expose the metal electrode pads.

12. The method of claim 11, wherein the conductive metal substrate comprises copper, nickel, or an alloy thereof.

13. The method of claim 11, wherein forming two or more metal electrode pads on the conductive metal substrate comprises electroplating a conductive metal on the conductive metal substrate.

14. The method of claim 11, wherein the dielectric layer comprises a resin.

15. The method of claim 11, wherein forming the dielectric layer on exposed regions of the conductive metals substrate between the metal electrode pads comprises sputtering a dielectric material on exposed regions of the conductive metal substrate between the metal electrode pads.

16. The method of claim 11, wherein forming two or more conductive metal lines on the dielectric layer comprises:
    depositing a conductive metal on the dielectric layer and the metal electrode pads; and
    etching the conductive metal to form the conductive metal lines.

17. The method of claim 11, wherein removing the conductive metal substrate to expose the metal electrode pads comprises wet etching the conductive metal substrate.

18. A method of making a semiconductor device, the method comprising:
    forming two or more metal electrode pads on a conductive metal substrate;
    forming a first dielectric layer on exposed regions of the conductive metals substrate between the metal electrode pads;
    forming a one or more additional dielectric layers on the first dielectric layer;
    forming two or more contact pads on the additional dielectric layers, wherein each of the contact pads is electrically coupled to one of the metal electrode pads;
    electrically coupling one or more semiconductor dies to the contact pads;
    at least partially encapsulating the first dielectric layer, the additional dielectric layers, and the semiconductor dies in a molding material;
    removing the conductive metal substrate to expose the metal electrode pads; and
    singulating the semiconductor device from an array of identical semiconductor devices.

19. The method of claim 18, wherein the first dielectric layer and the additional dielectric layers each comprise a polyimide.

20. The method of claim 18, wherein removing the conductive metal substrate to expose the metal electrode pads comprise wet etching.

* * * * *